(12) United States Patent
Suzuki

(10) Patent No.: US 12,200,570 B2
(45) Date of Patent: Jan. 14, 2025

(54) INFORMATION PROCESSING APPARATUS, INFORMATION PROCESSING METHOD, COMMUNICATION TERMINAL, COMMUNICATION METHOD, AND PROGRAM

(71) Applicant: SONY GROUP CORPORATION, Tokyo (JP)

(72) Inventor: Takashi Suzuki, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 420 days.

(21) Appl. No.: 17/602,598

(22) PCT Filed: Mar. 12, 2020

(86) PCT No.: PCT/JP2020/010800
§ 371 (c)(1),
(2) Date: Oct. 8, 2021

(87) PCT Pub. No.: WO2020/213312
PCT Pub. Date: Oct. 22, 2020

(65) Prior Publication Data
US 2022/0210608 A1    Jun. 30, 2022

(30) Foreign Application Priority Data

Apr. 15, 2019    (JP) .................................. 2019-076774

(51) Int. Cl.
*H04W 4/02* (2018.01)
*G01P 15/00* (2006.01)
*G01R 33/02* (2006.01)

(52) U.S. Cl.
CPC ............. *H04W 4/025* (2013.01); *G01P 15/00* (2013.01); *G01R 33/02* (2013.01)

(58) Field of Classification Search
CPC .............................. H04W 4/025; G01R 33/02
USPC ........................................................ 455/456.1
See application file for complete search history.

(56) References Cited

U.S. PATENT DOCUMENTS

2010/0273461 A1    10/2010    Choi
2016/0084652 A1    3/2016    Sekitsuka

FOREIGN PATENT DOCUMENTS

| CN | 103576849 A | 2/2014 |
| CN | 103969700 A | 8/2014 |
| CN | 108225324 A | 6/2018 |
| JP | 2006-030171 A | 2/2006 |
| JP | 2006275763 A | * 10/2006 |
| JP | 2006-337165 A | 12/2006 |
| JP | 2009069889 A | * 4/2009 |
| JP | 2010071918 A | * 4/2010 |
| JP | 2013185898 A | 9/2013 |
| JP | 2013210866 A | 10/2013 |

(Continued)

*Primary Examiner* — Ahmad F. Matar
*Assistant Examiner* — Jirapon Tulop
(74) *Attorney, Agent, or Firm* — Paratus Law Group, PLLC

(57) ABSTRACT

Provided is an information processing apparatus including: a calculation unit that calculates a terminal coordinate system magnetic vector on the basis of a spatial coordinate system magnetic vector and a posture of a communication terminal; and a notification unit that notifies the communication terminal of the terminal coordinate system magnetic vector by non-contact communication.

15 Claims, 12 Drawing Sheets

(56) References Cited

FOREIGN PATENT DOCUMENTS

| JP | 2016-057183 | A | 4/2016 |
|----|-------------|---|--------|
| JP | 2016-061766 | A | 4/2016 |
| JP | 2016-109609 | A | 6/2016 |
| JP | 2016114569  | A | 6/2016 |

\* cited by examiner

INFORMATION PROCESSING APPARATUS, INFORMATION PROCESSING METHOD, COMMUNICATION TERMINAL, COMMUNICATION METHOD, AND PROGRAM

CROSS REFERENCE TO PRIOR APPLICATION

This application is a National Stage Patent Application of PCT International Patent Application No. PCT/JP2020/010800 (filed on Mar. 12, 2020) under 35 U.S.C. § 371, which claims priority to Japanese Patent Application No. 2019-076774 (filed on Apr. 15, 2019), which are all hereby incorporated by reference in their entirety.

FIELD

The present disclosure relates to an information processing apparatus, an information processing method, a communication terminal, a communication method, and a program.

BACKGROUND

In recent years, there is an indoor positioning technology using geomagnetism. For example, in such an indoor positioning technology, the current position of the mobile terminal may be estimated on the basis of comparison between data output from the magnetic sensor of the mobile terminal and an indoor geomagnetic map acquired in advance. As calibration techniques for magnetic sensors, various techniques have been disclosed (see, for example, Patent Literatures to 1 to 3).

CITATION LIST

Patent Literature

Patent Literature 1: JP 2016-61766 A
Patent Literature 2: JP 2016-57183 A
Patent Literature 3: JP 2006-30171 A

SUMMARY

Technical Problem

However, it is desirable to provide a technology capable of improving the accuracy of positioning using a magnetic sensor.

Solution to Problem

According to the present disclosure, an information processing apparatus is provided that includes: a calculation unit that calculates a terminal coordinate system magnetic vector on a basis of a spatial coordinate system magnetic vector and a posture of a communication terminal; and a notification unit that notifies the communication terminal of the terminal coordinate system magnetic vector by non-contact communication.

According to the present disclosure, an information processing apparatus is provided that includes: a notification unit that notifies a communication terminal of a spatial coordinate system magnetic vector by non-contact communication, wherein the communication terminal calculates a terminal coordinate system magnetic vector on a basis of the spatial coordinate system magnetic vector and a posture of the communication terminal.

According to the present disclosure, an information processing method is provided that includes calculating a terminal coordinate system magnetic vector on a basis of a spatial coordinate system magnetic vector and a posture of a communication terminal; and notifying the communication terminal of the terminal coordinate system magnetic vector by non-contact communication.

According to the present disclosure, a communication terminal is provided that includes: an acquisition unit that acquires a terminal coordinate system magnetic vector calculated by an information processing apparatus on a basis of a spatial coordinate system magnetic vector and a posture of the communication terminal from the information processing apparatus by non-contact communication.

According to the present disclosure, a communication terminal is provided that includes: an acquisition unit that acquires a spatial coordinate system magnetic vector from an information processing apparatus by non-contact communication; and a calculation unit that calculates a terminal coordinate system magnetic vector on a basis of the spatial coordinate system magnetic vector and a posture of the communication terminal.

According to the present disclosure, a communication method performed by a communication terminal is provided that includes: acquiring a terminal coordinate system magnetic vector calculated by an information processing apparatus on a basis of a spatial coordinate system magnetic vector and a posture of the communication terminal from the information processing apparatus by non-contact communication.

According to the present disclosure, a program is provided that causes a computer to function as a communication terminal including: an acquisition unit that acquires a terminal coordinate system magnetic vector calculated by an information processing apparatus on a basis of a spatial coordinate system magnetic vector and a posture of the communication terminal from the information processing apparatus by non-contact communication.

Advantageous Effects of Invention

As described above, according to the present disclosure, there is provided a technology capable of improving positioning accuracy using a magnetic sensor. Note that the above effects are not necessarily limited, and any of the effects described in the present specification or other effects that can be grasped from the present specification may be exhibited together with or instead of the above effects.

DESCRIPTION OF EMBODIMENTS

Figure 1:
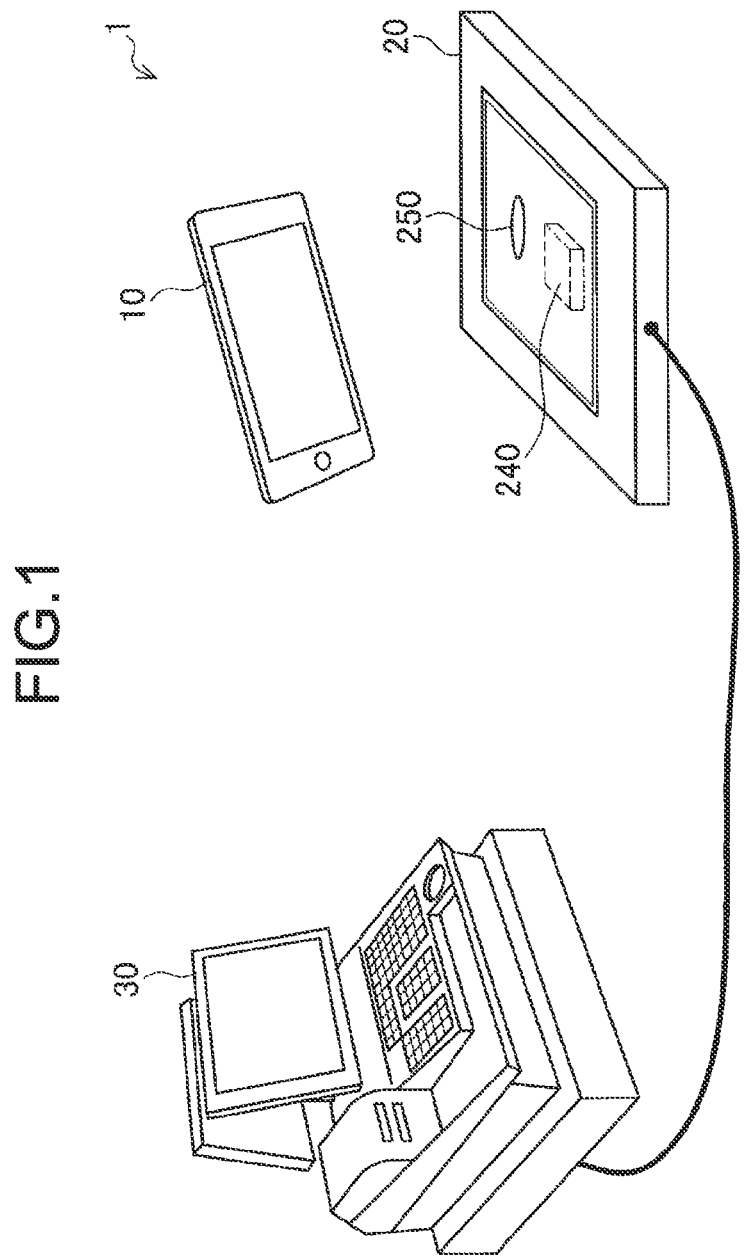
FIG. 1 is a diagram illustrating a configuration example of an information processing system according to an embodiment of the present disclosure.

Hereinafter, preferred embodiments of the present disclosure will be described in detail with reference to the accompanying drawings. Note that, in the present specification and the drawings, components having substantially the same functional configuration are denoted by the same reference numerals, and redundant description is omitted.

In addition, in the present specification and the drawings, a plurality of components having substantially the same or similar functional configurations may be distinguished by attaching different numbers after the same reference numerals. However, in a case where it is not particularly necessary to distinguish each of a plurality of components having substantially the same or similar functional configuration, only the same reference numeral is attached. In addition, similar components of different embodiments may be distinguished by adding different alphabets after the same reference numerals. However, in a case where it is not necessary to particularly distinguish each of similar components, only the same reference numeral is assigned.

Note that the description will be given in the following order.
1. Overview
2. Details of Embodiments
2.1. System Configuration Example
2.2. Functional Configuration Example of Mobile Terminal
2.3 Functional Configuration Example of Reading Device
3. Detailed Functions of System
4. Application Example
4.1. Application Example 1
4.2. Application Example 2
4.3. Application Example 3
5. Conclusion
6. Modification

1. OVERVIEW

First, an outline oft an embodiment of the present disclosure will be described. In recent years, there is an indoor positioning technology using geomagnetism. For example, in such an indoor positioning technology, the current position of the mobile terminal may be estimated on the basis of comparison between data output from the magnetic sensor of the mobile terminal and an indoor geomagnetic map acquired in advance. Various techniques are disclosed as calibration techniques for magnetic sensors.

In addition, there is a case where a component mounted on a mobile terminal is magnetized, a bias occurs in an output from a magnetic sensor of the mobile terminal, and a phenomenon that an output value from the magnetic sensor of: the mobile terminal unexpectedly deviates from an actual geomagnetic value may occur. Upon this, there is a case where such a bias value is calculated, and calibration for correcting the measurement value by the magnetic sensor may be performed using the calculated bias value. Examples of the calibration method include the following methods.

As a first method, there is a technology in which a magnetic sensor data group obtained by a user rotating a mobile terminal in an eight-letter shape (or randomly) for the purpose of calibration is plotted on a space, a bias value is acquired by calculating a center position of the plotted magnetic sensor data group, and calibration is performed using the acquired bias value. The operation of rotating the mobile terminal is often performed by the user on the basis of an instruction of an application before execution of a localization application of the mobile terminal.

As a second method, there is a technology in which a user performs calibration in the same manner as in the first example from a magnetic sensor data group obtained from a rotation operation of a mobile terminal occurring during daily use without performing a special operation for the purpose of calibration.

However, in the first method, each time the localization application is executed, the user is forced to perform an operation of rotating the mobile terminal, and thus a load is applied to the user. In addition, since a normal user does not have sufficient knowledge about calibration, the user cannot grasp what and how to do to perform the calibration, and the calibration itself may not be performed (alternatively, since the calibration is not sufficiently executed, the positioning accuracy by the magnetic sensor may deteriorate).

In the second method, since sensor data necessary for calibration is not necessarily obtained, there is a case where an accurate bias value cannot be obtained, and positioning accuracy by the magnetic sensor deteriorates.

Further, in both the first method and the second method, calibration needs to be executed in a place where the magnetic field is stable and a place where the change in the magnetic field accompanied by the change in position is small. However, in a case where calibration is executed at a place where the magnetic field is unstable or a place where the change in the magnetic field accompanied by the change in position is large, an accurate bias value cannot be obtained, thus positioning accuracy by the magnetic sensor may deteriorate.

As described above, according to a general calibration method, indoor positioning accuracy required as a localization application (or service) may not be obtained. Therefore, in the embodiment of the present disclosure, a technology capable of improving the accuracy of positioning using a magnetic sensor will be mainly described.

The outline of the embodiment of the present disclosure has been described above.

2. DETAILS OF EMBODIMENTS

Hereinafter, embodiments of the present disclosure will be described in detail.

2.1 System Configuration Example

Figure 2:
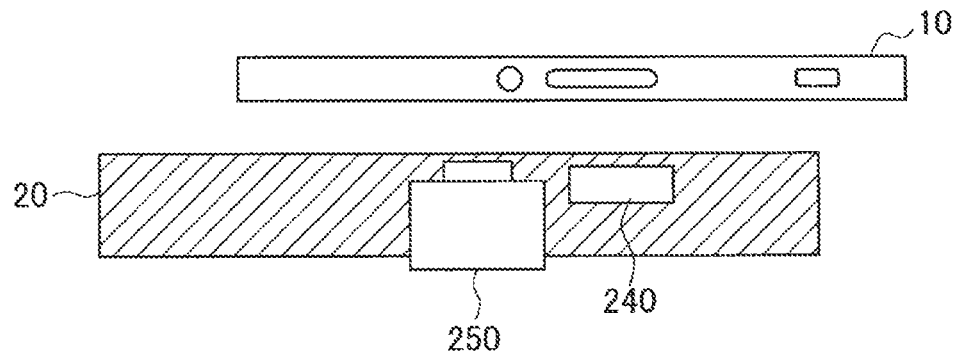
FIG. 2 is a side view of a reading device and a mobile terminal held over the reading device.

First, a configuration example of an information processing system according to an embodiment of the present disclosure will be described. FIG. 1 is a diagram illustrating a configuration example of an information processing system according to an embodiment of the present disclosure. As illustrated in FIG. 1, an information processing system 1 according to an embodiment of the present disclosure includes a mobile terminal 10, a reading device 20, and a point of sale system (POS) terminal 30. The reading device 20 and the POS terminal 30 may be connected in a wired manner as illustrated in FIG. 1, but may be connected in a wireless manner. FIG. 2 is a side view of the reading device 20 and the mobile terminal 10 held over the reading device 20.

The mobile terminal 10 is a communication terminal used by a user. The mobile terminal 10 includes an embedded secure element (eSE) as an example of an integrated circuit (IC) chip, and data recorded in the eSE is read by the reading device 20. In the embodiment of the present disclosure, a case where a smartphone is used as an example of the mobile terminal 10 is mainly assumed. However, another mobile terminal 10 may be used instead of the smartphone. For example, instead of the smartphone, a mobile phone, a tablet terminal, or a camera may be used. The mobile terminal 10 includes a magnetic sensor.

Figure 3:
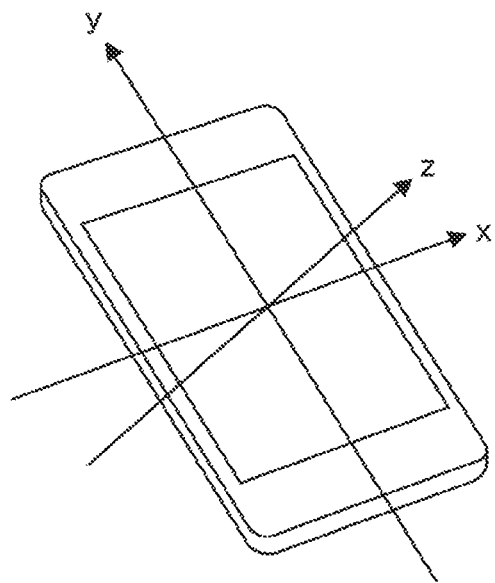
FIG. 3 is a diagram illustrating three axes of a magnetic sensor of a mobile terminal.

FIG. 3 is a diagram illustrating three axes of the magnetic sensor of the mobile terminal 10. Referring to FIG. 3, three axes (x axis, Y axis, z axis) of the magnetic sensor of the mobile terminal 10 are illustrated. In the example illustrated in FIG. 3, the x axis is set to the horizontal direction of the mobile terminal 10, the y axis is set to the vertical direction of the mobile terminal 10, and the z axis is set to the thickness direction of the mobile terminal 10. However, the directions of the three axes are not limited to such an example. A coordinate system (hereinafter, also referred to as a "terminal coordinate system") of the magnetic sensor of the mobile terminal 10 is formed by the three axes (x axis, y axis, and z axis), and sensor data (magnetic vector) output from the magnetic sensor of the mobile terminal 10 is expressed by a vector of the terminal coordinate system.

Figure 4:
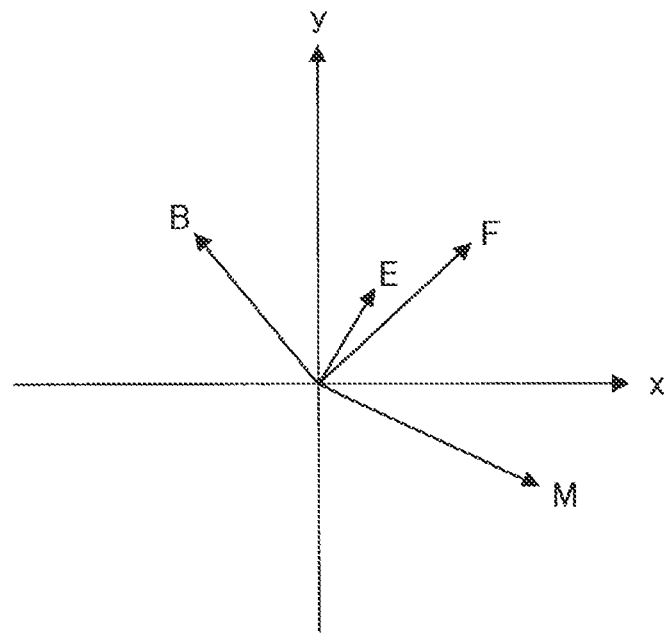
FIG. 4 is a diagram for explaining a magnetic vector detected by a magnetic sensor of a mobile terminal.

FIG. 4 is a diagram for explaining a magnetic vector detected by a magnetic sensor of the mobile terminal 10. As illustrated in FIG. 4, in a certain place in a room (for example, in a store or the like), a magnetic vector F detected by a magnetic sensor of the mobile terminal 10 is expressed as a composite vector or a geomagnetic vector (hereinafter, also referred to as "E"), a magnetic vector (hereinafter, also referred to as "B") received from a magnetized metal such as a reinforcing bar of a building or furniture, and a magnetic component vector (hereinafter, also referred to as "M") of the Mobile terminal 10. Note that, in FIG. 4, each vector is expressed a two-dimensional plane (xy plane), but in practice, each vector may be expressed three-dimensionally.

Of these vectors E, B, and M, the vector E is routinely stable except for long-term variations. The vector B is stable as long as there is no displacement of the mobile terminal 10. However, the amounts of change dB/dx, dB/dy, and dB/dz with respect to the displacement of the mobile terminal 10 in the x, y, and z directions may be large or small depending on the place where the mobile terminal 10 exists. In other words, if the place where the mobile terminal 10 exists is determined, the vector B may also be determined. On the other hand, it can be said that the vector M is stable as long as the mobile terminal 10 is not newly magnetized or demagnetized. However, the vector M changes when the mobile terminal 10 is unexpectedly magnetized, and is held by the mobile terminal 10.

For example, in a case where the mobile terminal 10 comes into contact with or approaches a strong permanent magnet included in a personal computer (PC), a speaker, or the like, or in a case where the mobile terminal 10 is near a place where a strong direct current flows, such as in a train, the vector M changes due to unexpected magnetization of the mobile terminal 10, and is held by the mobile terminal 10. Therefore, a situation in which the vector M and the magnetic vector F are changed even though the mobile terminal 10 exists at the same place may occur, and thus, it is general that the positioning accuracy based on the magnetic vector F is not improved.

Therefore, in the embodiment of the present disclosure, as will be described later, it is assumed that the magnetized state (bias) of the mobile terminal 10 is measured, and the measured bias is subtracted (offset) from the sensor data output from the magnetic sensor of the mobile terminal 10. In this way, by removing the influence of the sensor data magnetism output from the magnetic sensor of the mobile terminal 10, a more accurate external magnetic field vector (that is, the geomagnetic vector E+ vector B) may be obtained. Then, the positioning accuracy of the mobile terminal 10 can be improved by a more accurate external magnetic field vector.

Returning to FIGS. 1 and 2, the description will be continued. The reading device 20 is installed in a store (for example, a register) or the like. The reading device 20 includes a reader/writer (hereinafter, also referred to as "R/W"), and in a case where the mobile terminal 10 is held over, data recorded in the eSE of the mobile terminal 10 is read by the R/W by non-contact communication (alternatively, data is written from the R/W to the eSE of the mobile terminal 10 by non-contact communication). Typically, a near field communication (NFC) standard may be used as the standard of the non-contact communication. However, the non-contact communication standard is not limited to the NFC standard. In addition, the reading device 20 includes a magnetic sensor 240 and a camera module 250. The magnetic sensor 240 and the camera module 250 will be described in detail later.

The POS terminal 30 is connected to a network (not illustrated), and can communicate with a server (not illustrated) via the network (not illustrated). For example, sales data calculated by the POS terminal 30 is transmitted to a server (not illustrated) via a network (not illustrated). When receiving the data read from the eSE of the mobile terminal 10 by the reading device 20, the POS terminal 30 executes various types of processing on the basis of the read data. Further, the POS terminal 30 outputs data to be written in the SE of the mobile terminal 10 to the reading device 20.

The configuration example of the information processing system 1 according to the embodiment of the present disclosure has been described above.

2.2. Functional Configuration Example of Mobile Terminal

Next, a functional configuration example of the mobile terminal 10 will be described.

Figure 5:
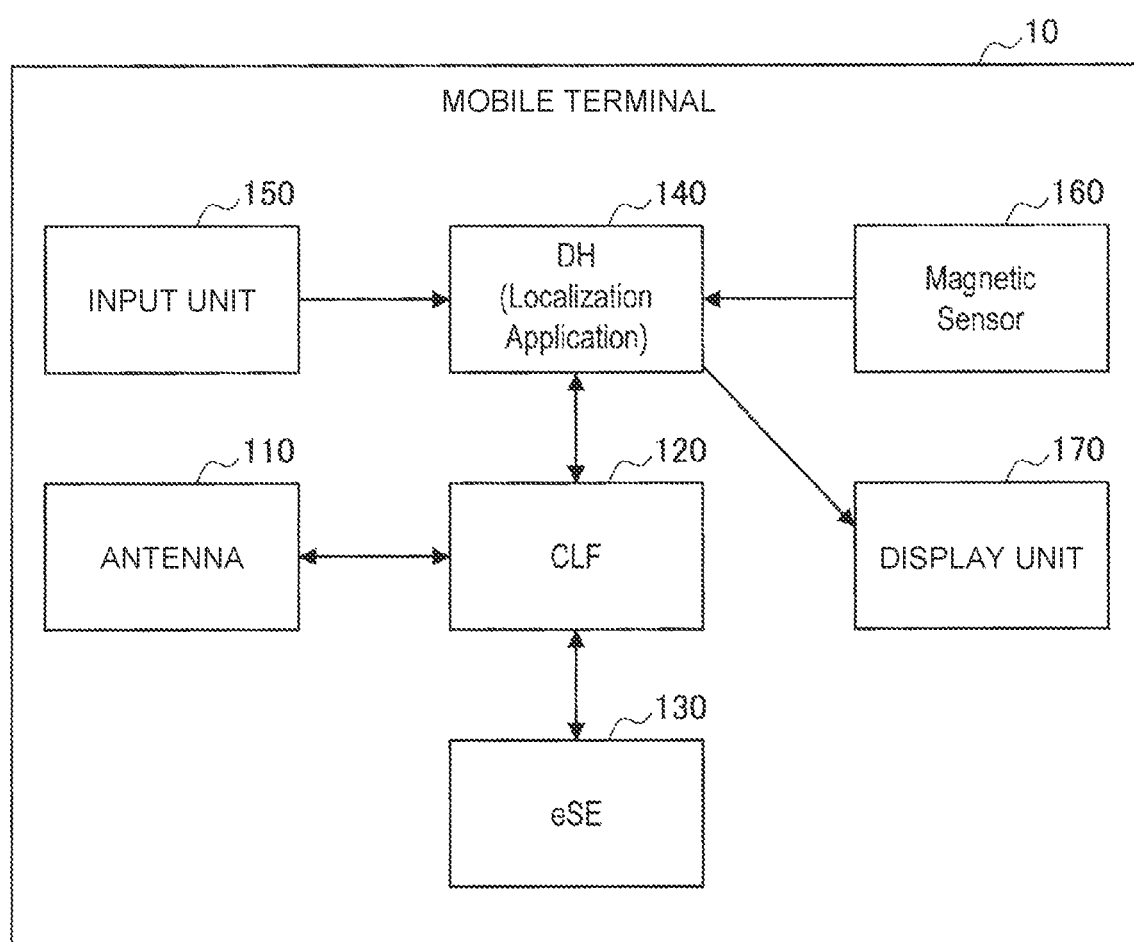
FIG. 5 is a diagram illustrating a functional configuration example of a mobile terminal.

FIG. 5 is a diagram illustrating a functional configuration example of the mobile terminal 10. As illustrated in FIG. 5, the mobile terminal 10 includes an antenna 110, a contactless front end (CLF) 120, an eSE 130, a device host (DH) 140, an input unit 150, a magnetic sensor 160, and a display unit 170. Hereinafter, these functional blocks included in the mobile terminal 10 will be described.

The antenna 110 performs non-contact communication with the reading device 20 when the reading device 20 approaches within a predetermined distance. The antenna 110 outputs the data received from the reading device 20 by the nor-contact communication to the CIF 120. In addition, the antenna 110 transmits the data input from the CLF 120 to the reading device 20 by non-contact communication.

The CLF 120 is connected to the antenna 110 and performs non-contact communication with the reading device 20 via the antenna 110. The CLF 120 selects a target desired by the reading device 20 according to a command transmitted from the reading device 20, and performs control so that communication with the selected target is performed. In addition, the CLF 120 has a built-in memory, and various types of data are stored in the memory as necessary.

The eSE 130 is a secure element as an example of an IC chip. In the eSE 130, unique identification information is recorded at the time of manufacturing. When the mobile terminal 10 is held over the reading device 20, the identification information is transmitted to the reading device 20 by non-contact communication by the antenna 110 via the CLF 120.

The DH 140 may function as an example of a control unit that controls each unit of the mobile terminal 10. The DH 140 may be configured by a processing unit, for example, one or a plurality of central processing units (CPUs). When these blocks are configured by a processing unit such as a CPU, the processing unit may be configured by an electronic circuit. The DH 140 may be realized by executing a program by such a processing unit. Such programs may include various applications. The various applications may include a localization application.

The input unit 150 has a function of receiving an operation input by the user. In the embodiment of the present disclosure, a case where the input unit 150 includes a touch panel is mainly assumed. However, the input unit 150 may include a mouse, a keyboard, a button, a switch, a lever, or the like. Furthermore, the input unit 150 may include a microphone that detects the user's voice.

The magnetic sensor 160 detects a magnetic vector and outputs the detected magnetic vector to the DH 140 as sensor data. The magnetic vector detected by the magnetic sensor 160 may include the vectors E, B, and M described above. In the embodiment of the present disclosure, a case where the magnetic sensor 160 outputs a magnetic vector to the DH 140 as a response to a request from the DIE 140 is mainly assumed. However, the timing at which the magnetic sensor 160 outputs the magnetic vector to the DH 140 is not limited.

The display unit 170 outputs various types of information. For example, the display unit 170 may include a display capable of performing display visible to the user. At this time, the display may be a liquid crystal display or an organic electro-luminescence (EL) display. Alternatively, the display unit 170 may be a light such as a light-emitting diode (LED).

Note that, in the embodiment of the present disclosure, a case where the antenna 110, the CLF 120, the eSE 130, the DH 140, the input unit 150, the magnetic sensor 160, and the display unit 170 exist inside the mobile terminal 10 is mainly assumed. However, at least one of the antenna 110, the CLF 120, the eSE 130, the DH 140, the input unit 150, the magnetic sensor 160, and the display unit 170 may exist outside the mobile terminal 10.

The functional configuration example of the mobile terminal 10 according to the embodiment of the present disclosure has been described above.

2.3. Functional Configuration Example of Reading Device

Next, a functional configuration example of the reading device 20 will be described.

Figure 6:
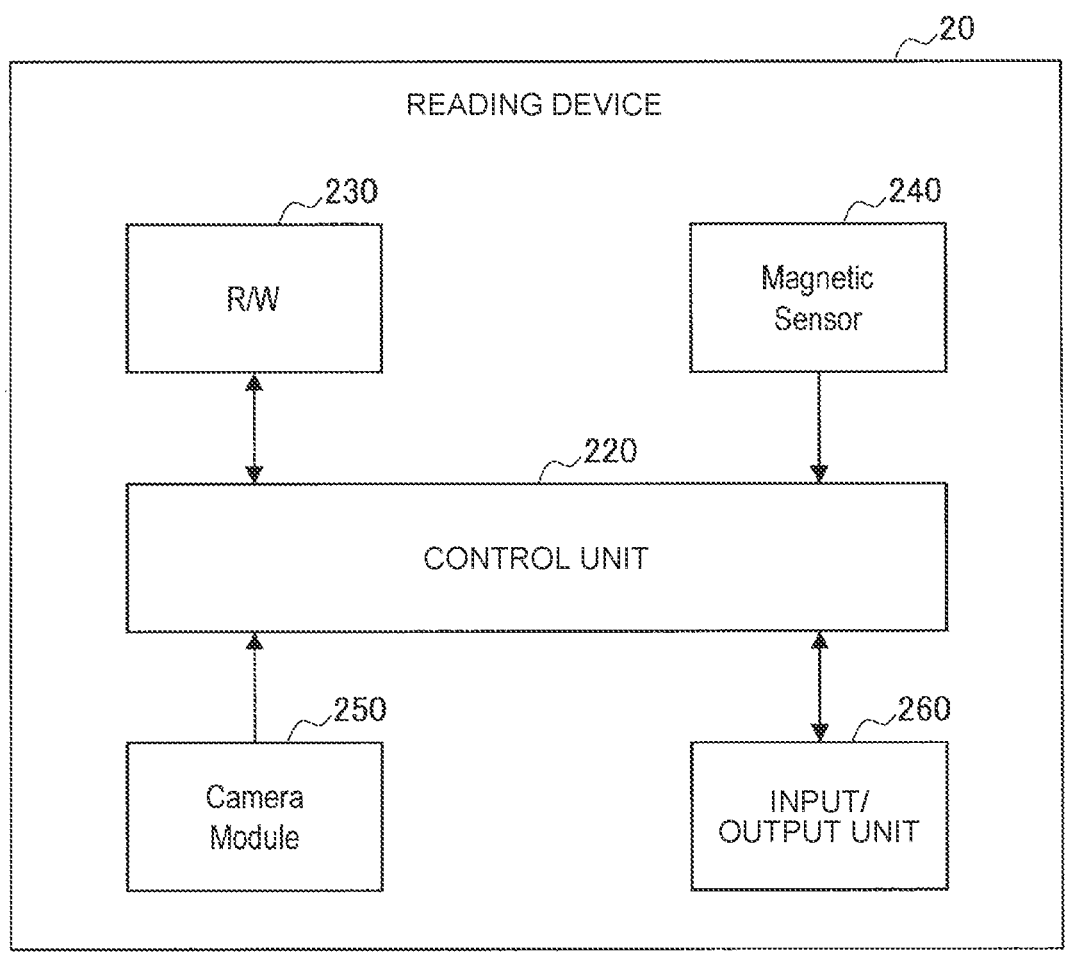
FIG. 6 is a diagram illustrating a functional configuration example of a reading device.

FIG. 6 is a diagram illustrating a functional configuration example of the reading device 20. As illustrated in FIG. 6, the reading device 20 includes a control unit 220, an R/W 230, a magnetic sensor 240, a camera module 250, and an input/output unit 260. Hereinafter, these functional blocks included in the reading device 20 will be described.

The control unit 220 may be configured by a processing unit, for example, one or a plurality of central processing units (CPUs). When these blocks are configured by a processing unit such as a CPU, the processing unit may be configured by an electronic circuit. The control unit 220 may be realized by executing a program by such a processing unit.

The R/W 230 performs non-contact communication with the mobile terminal 10 when the mobile terminal 10 approaches within a predetermined distance. The R/W 230 outputs data received from the mobile terminal 10 by non-contact communication to the control unit 220. In addition, the R/W 230 transmits data input from the control unit 220 to the mobile terminal 10 by non-contact communication.

The magnetic sensor 240 detects a magnetic vector, and outputs the detected magnetic vector to the control unit 220 as sensor data. Regarding the magnetic vector detected by the magnetic sensor 240, the timing at which the magnetic sensor 240 outputs the magnetic vector to the control unit 220 is not limited.

The camera module 250 obtains an image by imaging the mobile terminal 10 held over the reading device 20. In the embodiment of the present disclosure, a case where the camera module 250 includes an image sensor, and image data obtains an image by imaging the mobile terminal 10 is mainly assumed. Here, the type of the image sensor is not limited. For example, the image sensor may be a visible light sensor or an infrared sensor. The image captured by the camera module 250 is used for recognizing the posture of the mobile terminal 10. Note that, as will be described later, information other than the image captured by the camera module 250 may also be used to use of the posture of the mobile terminal 10.

The input/output unit 260 inputs and outputs various types of information. For example, the input/output unit 260 may include a display capable of performing display that can be visually recognized by the user. At this time, the display may be a liquid crystal display or an organic electro-luminescence (EL) display. Alternatively, the input/output unit 260 may be a light such as a light-emitting diode (LED) Furthermore, the input/output unit 260 may include an input unit. The input unit may be a switch, a button, a touch panel, or another input device.

Note that, in the embodiment of the present disclosure, a case where the control unit 220, the R/W 230, the magnetic sensor 240, the camera module 250, and the input/output unit 260 exist inside the reading device 20 is mainly assumed. However, at least one of the control unit 220, the R/W 230, the magnetic sensor 240, the camera module 250, and the input/output unit 260 may exist outside the reading device 20 (for example, the POS terminal 30 connected to the reading device 20, and the like).

The functional configuration example of the reading device 20 according to the embodiment of the present disclosure has been described above.

3. DETAILED FUNCTIONS OF SYSTEM

Hereinafter, an example of detailed functions of the information processing system 1 according to an embodiment of the present disclosure will be described.

Figure 7:
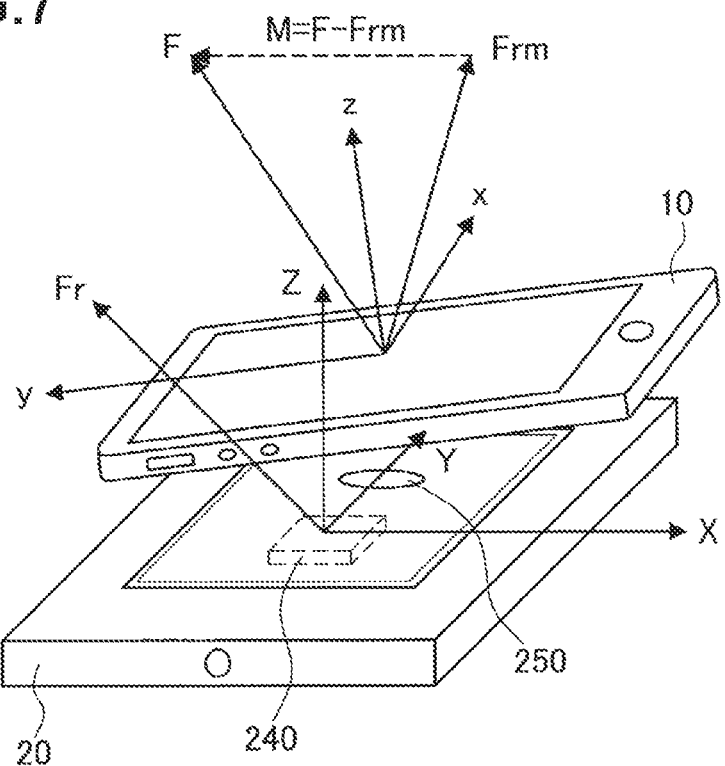
FIG. 7 is a diagram for explaining an example of detailed functions: of the information processing system according to the embodiment of the present disclosure.

FIG. 7 is a diagram for explaining an example of detailed functions of the information processing system 1 according to the embodiment of the present disclosure. Here, a case where the reading device 20 and the POS terminal 30 are installed in a store is mainly assumed. The R/W 230 of the reading device 20 grasps the magnetic vector above the R/W 230 (for example, a touch surface) in a normal state. For example, the magnetic vector above the R/W 230 may be measured in advance by the magnetic sensor 240 of the reading device 20, or may be measured by the magnetic sensor 240 at the timing when the mobile terminal 10 is held over the reading device 20.

Then, a case where the localization application of the mobile terminal 10 is activated by a predetermined activation operation by the user when the user carrying the mobile terminal 10 enters the store is assumed. When the user determines an item to be purchased at the store, the user holds the mobile terminal 10 over the reading device 20. Referring to FIG. 7, a state in which the mobile terminal 10 is held over the reading device 20 is illustrated.

Also, referring to FIG. 7, three axes (X axis, Y axis, Z axis) of the magnetic sensor 240 of the reading device 20 are illustrated. In the example illustrated in FIG. 7, the X axis is set in the horizontal direction of the reading device 20, the Y axis is set in the vertical direction of the reading device 20, and the Z axis is set in the height direction of the reading device 20. However, the directions of the three axes are not limited to such an example. A coordinate system (hereinafter, also referred to as a "spatial coordinate system") of the magnetic sensor 240 of the reading device 20 is formed by the three axes (X axis, Y axis, and Z axis), and sensor data (magnetic vector) output from the magnetic sensor 240 of the reading device 20 is expressed by a vector of a spatial coordinate system.

Referring to FIG. 7, a magnetic vector Fr (spatial coordinate system magnetic vector) measured by the magnetic sensor 240 of the reading device 20 is represented. When the mobile terminal 10 is held over the reading device 20, the camera module 250 obtains an image by imaging the mobile terminal 10. The control unit 220 recognizes the posture of the mobile terminal 10 on the basis of the image captured by the camera module 250. At this time, the reading device 20 needs to grasp the relationship between the coordinate system and the posture of the mobile terminal 10.

The control unit 220 calculates a magnetic vector Frm (terminal coordinate system magnetic vector) in the terminal coordinate system (xyz) on the basis of the magnetic vector Fr (spatial coordinate system magnetic vector) in the spatial coordinate system (XYZ) and the posture of the mobile terminal 10 (calculation unit). More specifically, the control unit 220 sets the posture of the mobile terminal 10 as a conversion A from the spatial coordinate system (XYZ) to the terminal coordinate system (xyz), and applies inverse conversion of the conversion A to the magnetic vector Fr (spatial coordinate system magnetic vector) to calculate the magnetic vector Frm (terminal coordinate system magnetic vector) in the terminal coordinate system (xyz).

The control unit 220 notifies the mobile terminal 10 of the magnetic vector Frm (terminal coordinate system magnetic vector) via the R/W 230 by non-contact communication (notification unit). In the mobile terminal 10, the CLF 120 receives the magnetic vector Frm (terminal coordinate system magnetic vector) from the reading device 20 via the antenna 110 by non-contact communication. The DI-H 140 acquires a magnetic vector Frm (terminal coordinate system magnetic vector) received by the CLF 120 (acquisition unit). When acquiring the magnetic vector Frm (terminal coordinate system magnetic vector), the DH 140 outputs a sensing request to the magnetic sensor 160.

Subsequently, the magnetic sensor 160 performs sensing when receiving a sensing request from the DH 140. The magnetic sensor 160 obtains a magnetic vector (first sensing data) by sensing. The magnetic vector obtained by the magnetic sensor 160 is output to the DH 140. Referring to FIG. 7, the magnetic vector obtained by the magnetic sensor 160 is expressed as F. The DH 140 calculates a bias value on the basis of the sensor data output from the magnetic sensor 160 and a magnetic vector Frm (terminal coordinate system magnetic vector).

Specifically, as described above, the vector F is a composite vector of E, B, and M. On the other hand, Frm is a composite vector of the vectors E and B. Therefore, the DH 140 calculates a vector M (magnetic component vector) by subtracting the magnetic vector Frm from the magnetic vector F obtained by the magnetic sensor 160. The DH 140 sets the vector M (magnetic component vector) calculated in this manner as a bias value. By setting the bias value, the calibration of the magnetic sensor 160 is completed.

After completing the calibration of the magnetic sensor 160, the DH 140 specifies the position information of the mobile terminal 10 on the basis of the bias value, the sensor data (first sensor data) output from the magnetic sensor 160, and the magnetic vector map (specifying unit).

Figure 8:
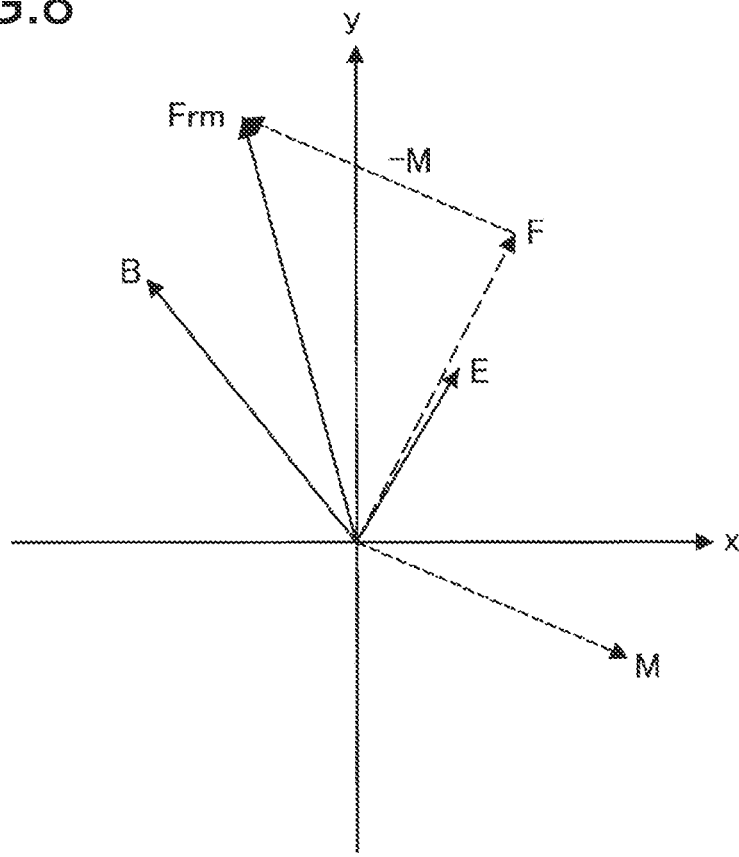
FIG. 8 is a diagram for describing specification of position information of a mobile terminal.

FIG. 8 is a diagram for describing specification of position information of the mobile terminal 10. The vector F is sensor data (first sensor data) output from the magnetic sensor 160, and is a composite vector of E, B, and M. The vector M is a magnetic component vector and is calculated in advance by calibration of the magnetic sensor 160. The magnetic vector Frm is a composite vector of the vectors E and B. Therefore, the DH 140 can calculate Frm by F-M. The DH 140 specifies the position information of the mobile terminal 10 on the basis of the magnetic vector Frm and the magnetic vector map.

Figure 9:
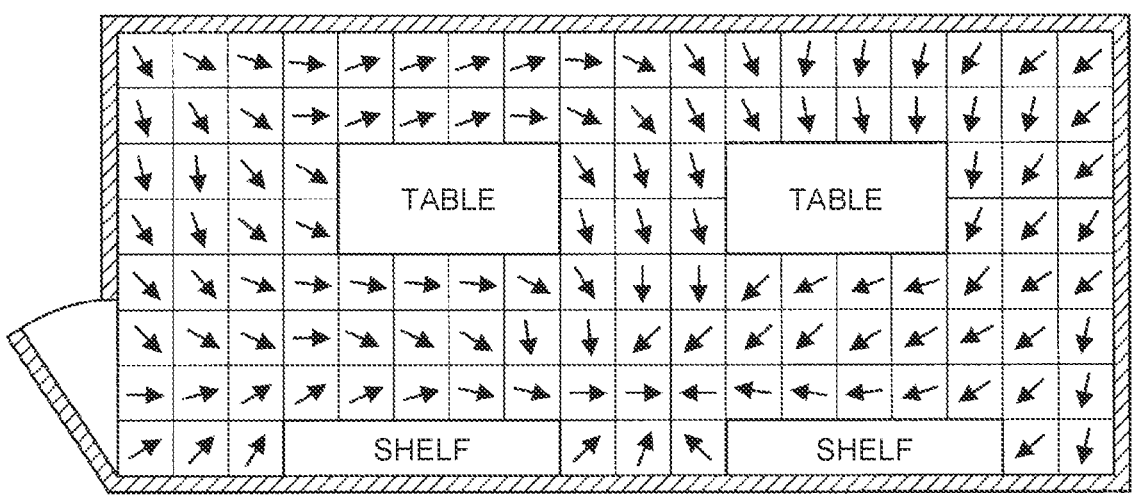
FIG. 9 is a diagram illustrating an example of a magnetic vector map.

FIG. 9 is a diagram illustrating an example of a magnetic vector map. The magnetic vector map is a map indicating a magnetic vector for each position in the real space. In the example illustrated in FIG. 9, the magnetic vector for each position in the store is indicated by each arrow. In a case where a magnetic vector matching or similar to the magnetic vector Frm is found in the magnetic vector map, the DH 140 specifies position information corresponding to the found magnetic vector as position information of the mobile terminal 10.

Note that it is assumed that the position information of the mobile terminal 10 does not change beyond a predetermined range from the previously specified position information of the mobile terminal 10. Therefore, when a magnetic vector that matches or is similar to the magnetic vector Frm is found in the magnetic vector map at a position indicated by the position information within a predetermined range from the previously specified position information of the mobile terminal 10, the DH 140 may specify the position information corresponding to the found magnetic vector as the position information of the mobile terminal 10. In addition, the position may be specified by a combination with another sensor, for example, an acceleration sensor, a gyro sensor, ILE, WiFi, or the like.

Figure 10:
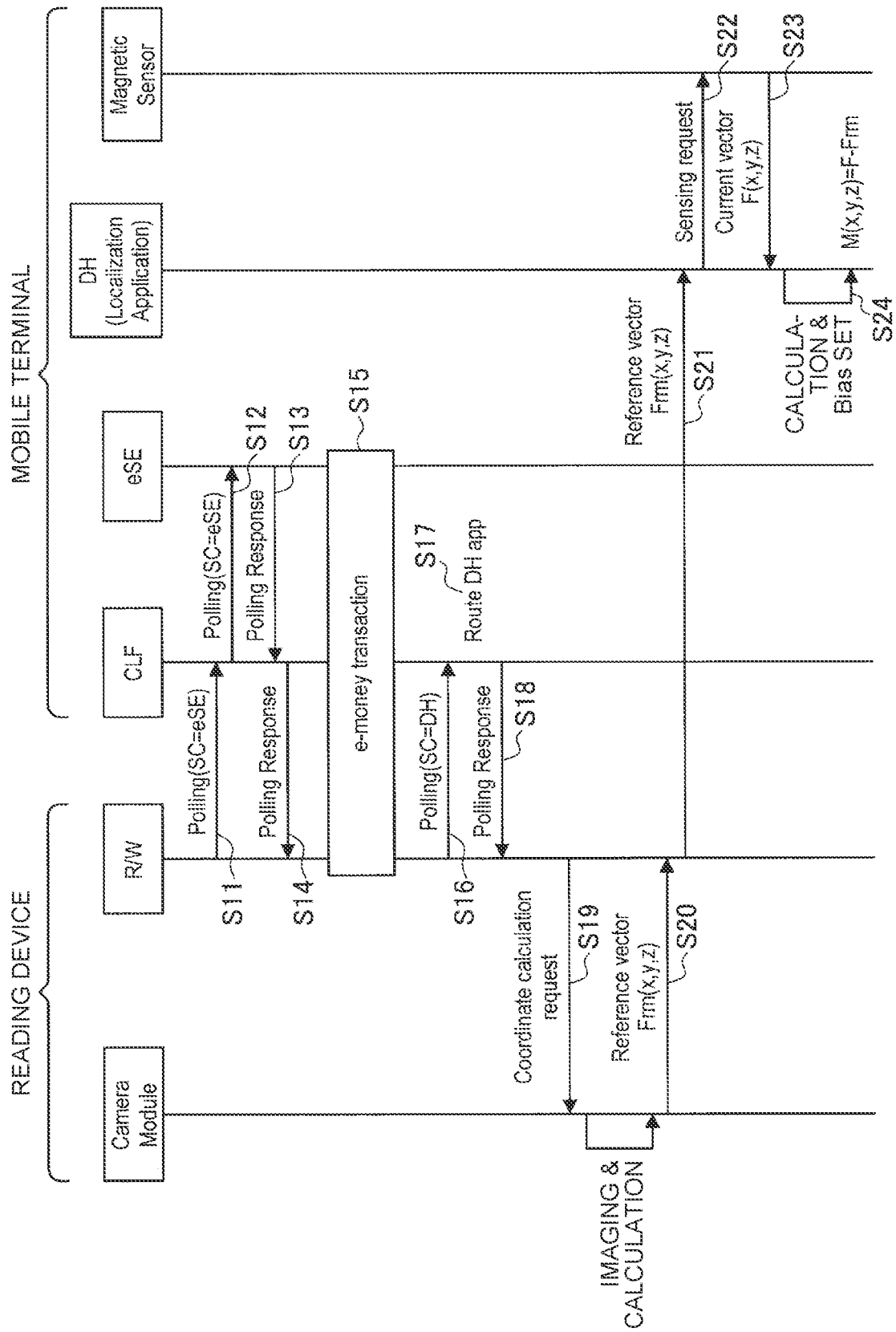
FIG. 10 is a sequence diagram illustrating an operation example of the information processing system according to the embodiment of the present disclosure.

FIG. 10 is a sequence diagram illustrating an operation example of the information processing system 1 according to the embodiment of the present disclosure. As illustrated in FIG. 10, when the mobile terminal 10 is held over the reading device 20, the R/W 230 of the reading device 20 transmits polling addressed to the eSE 130 to the mobile terminal 10 by non-contact communication (S11). In the mobile terminal 10, polling is received by the CLE 120 via the antenna 110, and the polling is output to the eSE 130 (S12).

The eSE 130 outputs the polling response to the CLF 120 (S13), and the CLF 120 transmits the polling response to the R/W 230 via the antenna 110 by non-contact communication (S14). Subsequently, e-money transaction is performed between the R/W 230 and the eSE 130 (S15). Subsequently, the R/W 230 transmits polling for changing the route so as to pass through the DH 140 to the mobile terminal 10 by non-contact communication (S16). In the mobile terminal 10, polling is received by the CLF 120 via the antenna 110, and the route is changed on the basis of the polling (S17).

The CLF 120 transmits a polling response to the R/W 230 via the antenna 110 by non-contact communication (S18). Subsequently, the R/W 230 outputs an Frm calculation request to the camera module 250. Upon receiving the Frm calculation request, the camera module 250 images the mobile terminal 10 to obtain an image. The control unit 220 recognizes the posture of the mobile terminal 10 on the basis of the image, and calculates a magnetic vector Frm (terminal coordinate system magnetic vector) in the terminal coordinate system (xyz) on the basis of the posture of the mobile terminal 10 and the magnetic vector Fr (spatial coordinate system magnetic vector) in the spatial coordinate system (XYZ).

The control unit 220 outputs the magnetic vector Frm to the R/W 230 (S20), and the R/W 230 transmits the magnetic vector Frm to the mobile terminal 10 by non-contact communication. The CLF 120 receives the magnetic vector Frm via the antenna 110 by non contact communication, and outputs the magnetic vector Frm to the DH 140 (S21). Upon receiving the magnetic vector Frm, the DH 140 outputs a sensing request to the magnetic sensor 160 (S22). Upon receiving the sensing request, the magnetic sensor 160 performs sensing and outputs the magnetic vector F obtained by the sensing to the DH 140 (S23).

When the DH 140 receives the magnetic vector obtained by the magnetic sensor 160, the DH 140 calculates a magnetic component vector M by subtracting the Magnetic vector Frm from the magnetic vector F, and sets the magnetic component vector M as a bias value (S24). By setting the bias value, the calibration of the magnetic sensor 160 is completed. After completion of the calibration of the magnetic sensor 160, the DH 140 specifies the position information of the mobile terminal 10 on the basis of the bias value, the sensor data (second sensor data) output from the magnetic sensor 160, and the magnetic vector map.

The example of the detailed functions of the information processing system 1 according to the embodiment of the present disclosure has been described above.

Note that, in the above description, a case where the posture of the mobile terminal 10 is recognized on the basis of the image captured by the camera module 250 has been assumed. However, the posture of the mobile terminal 10 may be recognized by other methods. For example, in a case where an acceleration sensor is mounted on the mobile terminal 10, the posture of the Mobile terminal 10 may be recognized on the basis of an image captured by the camera module 250 and acceleration detected by the acceleration sensor of the mobile terminal 10.

In the above description, a case where the reading device 20 calculates the magnetic vector Frm (terminal coordinate system magnetic vector) is assumed. However, mobile terminal 10 may calculate magnetic vector Frm (terminal coordinate system magnetic vector). In such a case, the reading device 20 may notify the mobile terminal 10 of the magnetic vector Fr (spatial coordinate system magnetic vector) and the posture of the mobile terminal 10, and the mobile terminal 10 may calculate the magnetic vector Frm (terminal coordinate system magnetic vector) on the basis of the magnetic vector Fr (spatial coordinate system magnetic vector) and the posture of the mobile terminal 10.

4. APPLICATION EXAMPLE

Hereinafter, an application example of the information processing system 1 according to the embodiment of the present disclosure will be described.

4.1. Application Example 1

First, an application example 1 of the information processing system 1 according to an embodiment of the present disclosure will be described.

In the above description, a case where the reading device 20 notifies the mobile terminal 10 of the magnetic vector Frm (terminal coordinate system magnetic vector) is assumed. However, there is a demand for prompting the user to actively hold the mobile terminal 10 over the reading device 20. Therefore, in the reading device 20, the control unit 220 may notify the mobile terminal 10 of predetermined reward information via the R/W 230 by non-contact communication in addition to the magnetic vector Frm (terminal coordinate system magnetic vector). At this time, in the mobile terminal 10, the DH 140 preferably acquires the magnetic vector Firm (terminal coordinate system magnetic vector) and the predetermined reward information from the reading device 20 via the antenna 110 and the CLF 120 by non-contact communication.

The reward information may be a point (such as a store visit point) or a coupon (such as a store coupon) that a user can receive some reward. Points accumulated equal to or more than the threshold value may be exchangeable with a product. Further, the coupon may be exchangeable for a part or all of the product price.

A function of receiving reward information may be added to the localization application of the mobile terminal 10. On the other hand, the reading device 20 that transmits the magnetic vector Frm (terminal coordinate system magnetic vector) and the reward information may be typically provided at a register or the like of a store. However, the function of transmitting the magnetic vector Frm (terminal coordinate system magnetic vector) and the reward information may be implemented in a point granting terminal installed at the store entrance or in the store, or may be implemented in a reader/writer of a vending machine installed at the store entrance or in the store. As a result, it is further promoted that the user actively holds the mobile terminal 10 over the reading device 20.

Figure 11:
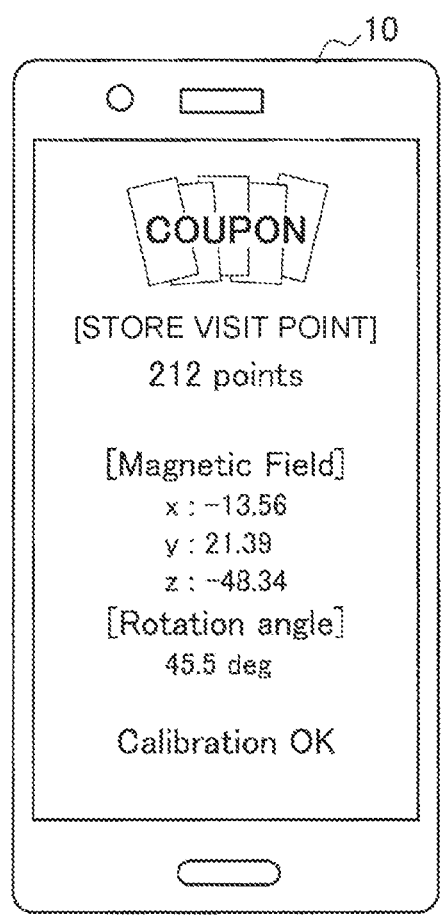
FIG. 11 is a diagram illustrating a display example of store visit points.

The DH 140 may be capable of controlling display of predetermined reward information (output control unit). FIG. 11 is a diagram illustrating a display example of store visit points. Referring to FIG. 11, an example in which the DH 140 of the mobile terminal 10 controls the display of the store visit point as an example of the reward information is illustrated. Furthermore, referring to FIG. 11, an example is illustrated in which the DH 140 controls display of calibration information of the magnetic sensor 160. The calibration information of the magnetic sensor 160 may be information related to the magnetic vector Frm (terminal coordinate system magnetic vector).

The application example 1 of the information processing system 1 according to the embodiment of the present disclosure has been described above.

4.2. Application Example 2

Next, an application example 2 of the information processing system 1 according to the embodiment of the present disclosure will be described.

In the above description, a case where the reading device 20 notifies the mobile terminal 10 of the magnetic vector Frm (terminal coordinate system magnetic vector) is assumed. However, for example, in an indoor localization application, the initial position of the mobile terminal 10 is often estimated on the basis of a signal of Bluetooth (registered trademark) beacon, WiFi (registered trademark), and the like. At this time, there is a case where an error may be included in units of several meters depending on the state of the signal, and thus it may be difficult to accurately estimate the initial position. As can be grasped from such an example, there is a demand for further improving the positioning accuracy of the mobile terminal 10.

Therefore, in the reading device 20, the control unit 220 preferably notifies the mobile terminal 10 of the position information of the reading device 20 via the R/W 230 by non-contact communication. At this time, in the mobile terminal 10, the DH 140 preferably acquires the position information of the reading device 20 from the reading device 20 by non-contact communication via the antenna 110 and the CLF 120, and specifies the position information of the reading device 20 as the position information of the mobile terminal 10. The position information of the reading device 20 may be information indicating the absolute position of the reading device 20 and may be measured in advance.

The position of the reading device 20 is typically fixed and unchanged. Therefore, if the position information of the reading device 20 is specified as the position information of the mobile terminal 10 every time the mobile terminal 10 is held over the reading device 20, the positioning accuracy of the mobile terminal 10 is improved. Note that the R/W having the function of notifying the position information may be installed anywhere.

Figure 12:
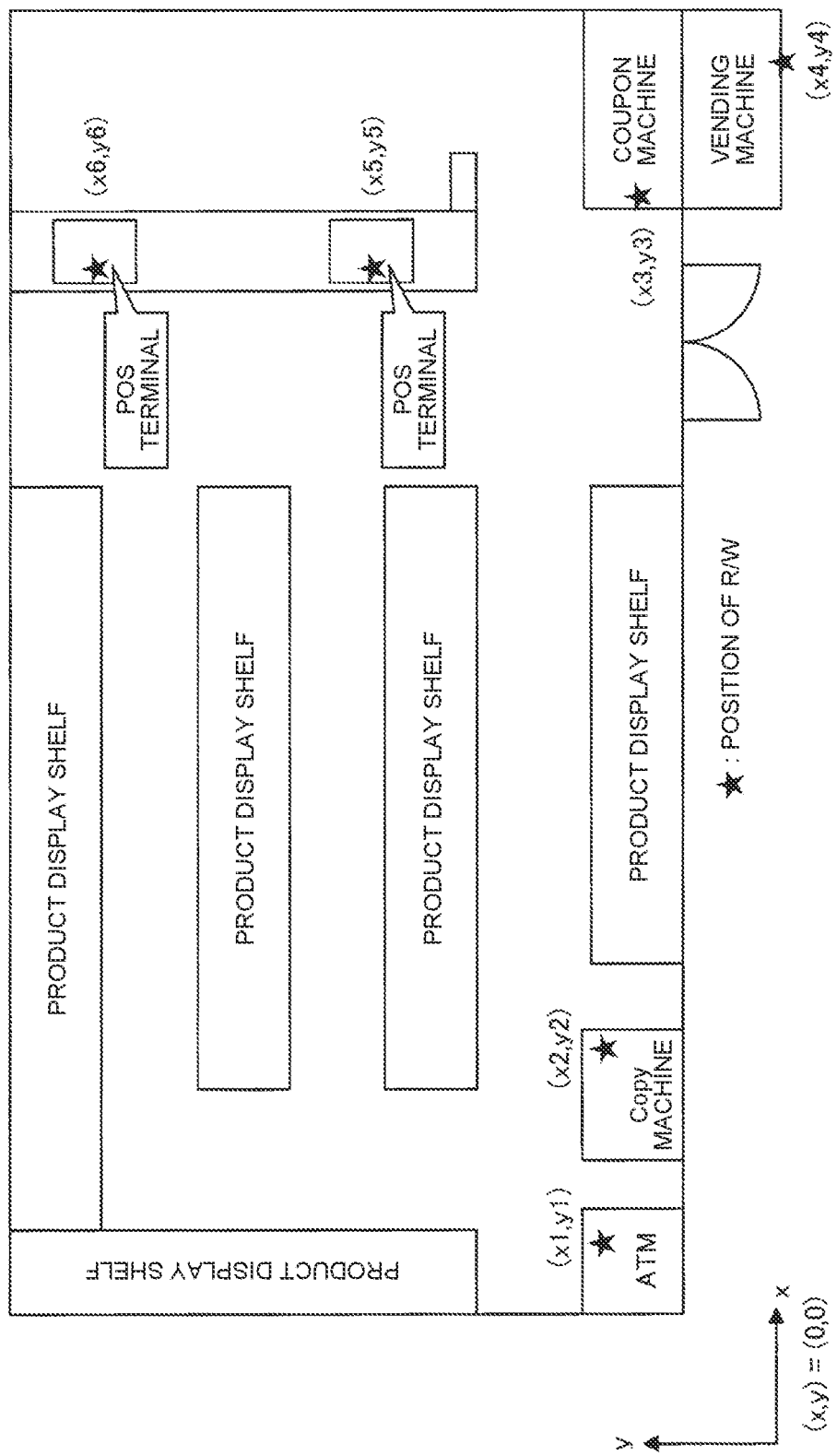
FIG. 12 is a diagram illustrating an installation example of an R/W having a function of notifying position information.

FIG. 12 is a diagram illustrating an installation example of the R/W having a function of notifying position information. In the example illustrated in FIG. 12, stars indicate the installation location of the R/W. In the installation location of the R/W, absolute positions (x1, y1) to (x6, y6) of the R/W are indicated. That is, the R/W has a function of notifying the absolute positions (x1, y1) to (x6, y6) of the R/W.

Specifically, the absolute position (x1, y1) is notified from the R/W of the ATM, the absolute position (x2, y2) is notified from the R/W of the copier, the absolute position (x3, y3) is notified from the R/W of the coupon terminal, the absolute position (x4, y4) is notified from the R/W of the vending machine, and the absolute positions (x5, y5) and (x6, y6) are notified from the R/W of the two POS terminals, respectively. In addition, the R/W having a function of notifying the position information may be installed in a store visit point terminal or may be installed in a ticket gate.

Figure 13:
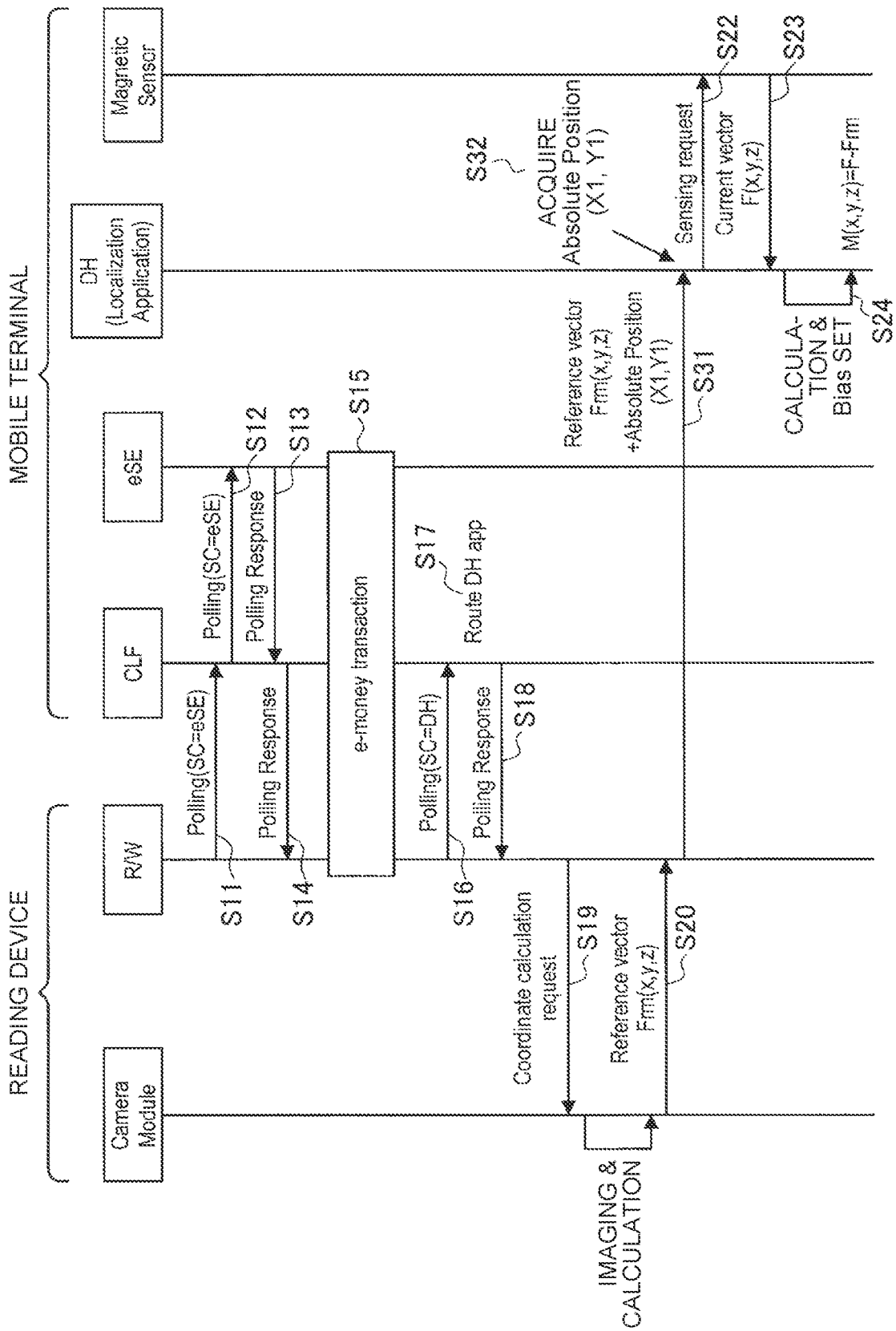
FIG. 13 is a sequence diagram illustrating an operation example of application example 2 of the information processing system according to the embodiment of the present disclosure.

FIG. 13 is a sequence diagram illustrating an operation example of application example 2 of the information processing system 1 according to the embodiment of the present disclosure. Here, a difference from the operation example illustrated in FIG. 10 in the operation example illustrated in FIG. 13 will be mainly described. S11 to S20 illustrated in FIG. 13 are executed similarly to S11 to S20 illustrated in FIG. 10. Subsequently, the R/P 230 transmits the magnetic vector Frm and the absolute position of the R/W 230 to the mobile terminal 10 by non-contact communication.

The CLF 120 receives the magnetic vector Frm and the absolute position of the R/W 230 via the antenna 110 by non-contact communication, and outputs the magnetic vector Frm and the absolute position of the F/W 230 to the DH 140 (S31). When the DH 140 receives the magnetic vector Frm and the absolute position of the R/P 230 (S32), the DH 140 specifies the absolute position of the F/W 230 as the position information of the mobile terminal 10. Subsequently, S22 to S24 illustrated in FIG. 13 are executed similarly to S22 to S24 illustrated in FIG. 10.

The application example 2 of the information processing system 1 according to the embodiment of the present disclosure has been described above.

4.3. Application Example 3

Next, an application example 3 of the information processing system 1 according to the embodiment of the present disclosure will be described.

Figure 14:
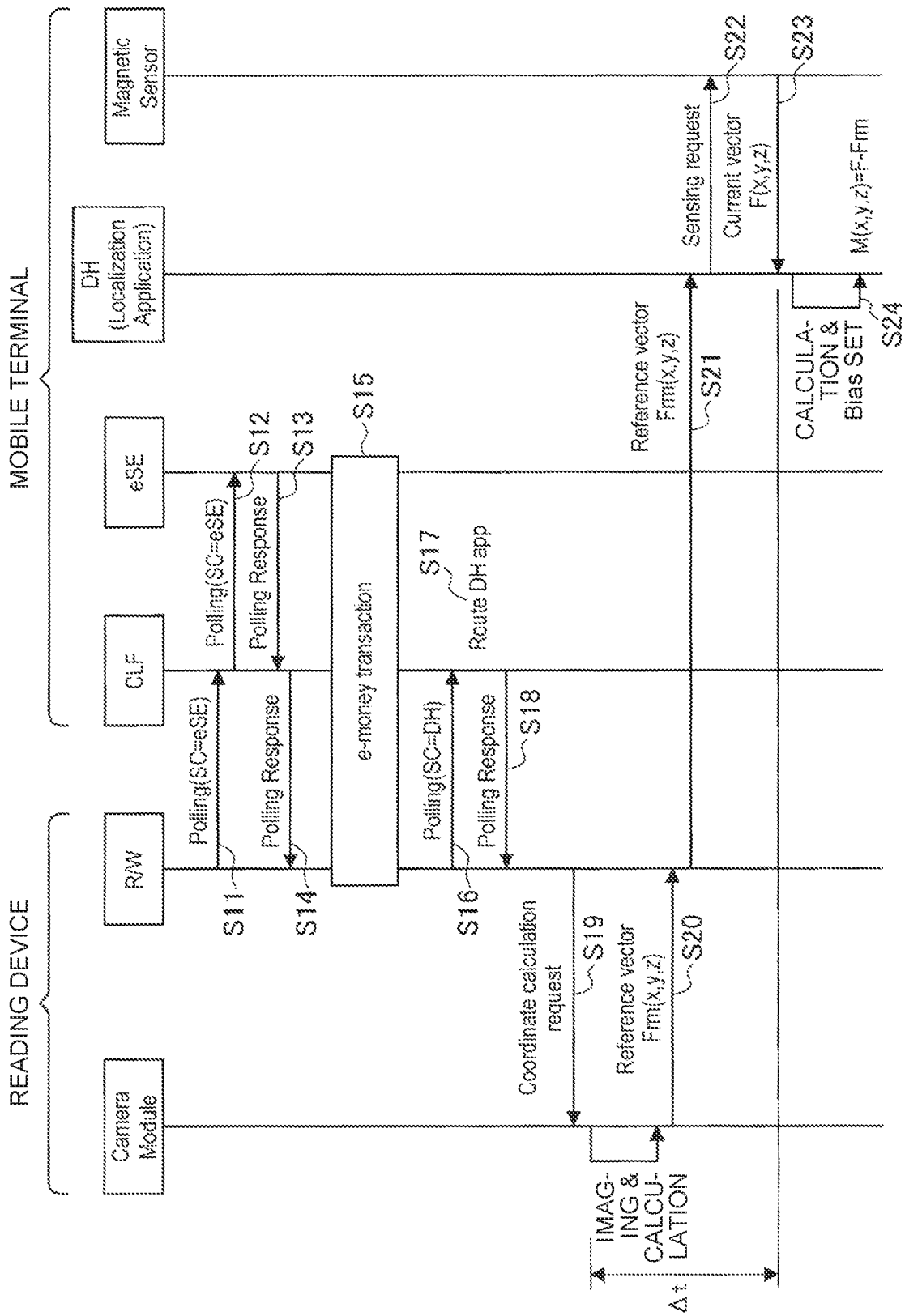
FIG. 14 is a diagram for explaining points to be improved of the information processing system according to the embodiment of the present disclosure.

FIG. 14 is a diagram for explaining points to be improved of the information processing system 1 according to the embodiment of the present disclosure. As illustrated in FIG. 14, in the above description, it is assumed that an image is captured by the camera module 250 of the reading device 20, the magnetic vector Frm is calculated on the basis of the image, the magnetic vector Frm is notified from the reading device 20 to the mobile terminal 10, and then the magnetic vector F output from the magnetic sensor 160 of the mobile terminal 10 is obtained. However, a time difference (delay Δt) may occur until the magnetic vector F is obtained after the image for calculating the magnetic vector Frm is captured.

Here, when the user holds the mobile terminal 10 over the reading device 20, the mobile terminal 10 is not necessarily completely stopped. Therefore, it is assumed that the posture of the mobile terminal 10 is changed during the time difference (delay Δt), and a case where an error occurs between the bias value calculated on the basis of the magnetic vector Firm and the magnetic vector F and the accurate bias value is assumed. Therefore, there is a demand for reducing an error generated between the calculated bias value and the accurate bias value.

Therefore, in the reading device 20, the control unit 220 preferably notifies the mobile terminal 10 of the imaging time of the image by the camera module 250 based on the predetermined timing via the R/W 230. Then, in the mobile terminal 10, the DH 140 acquires the imaging time of the image (for recognizing the posture of the mobile terminal 10) with reference to the predetermined timing via the antenna 110 and the CLF 120, and acquires sensor data whose sensing time with reference to the predetermined timing is closest to the imaging time among a plurality of pieces of sensor data periodically output from the magnetic sensor 160 as the magnetic vector F used for bias value calculation. As a result, it is possible to reduce an error generated between the calculated bias value and the accurate bias value.

Figure 15:
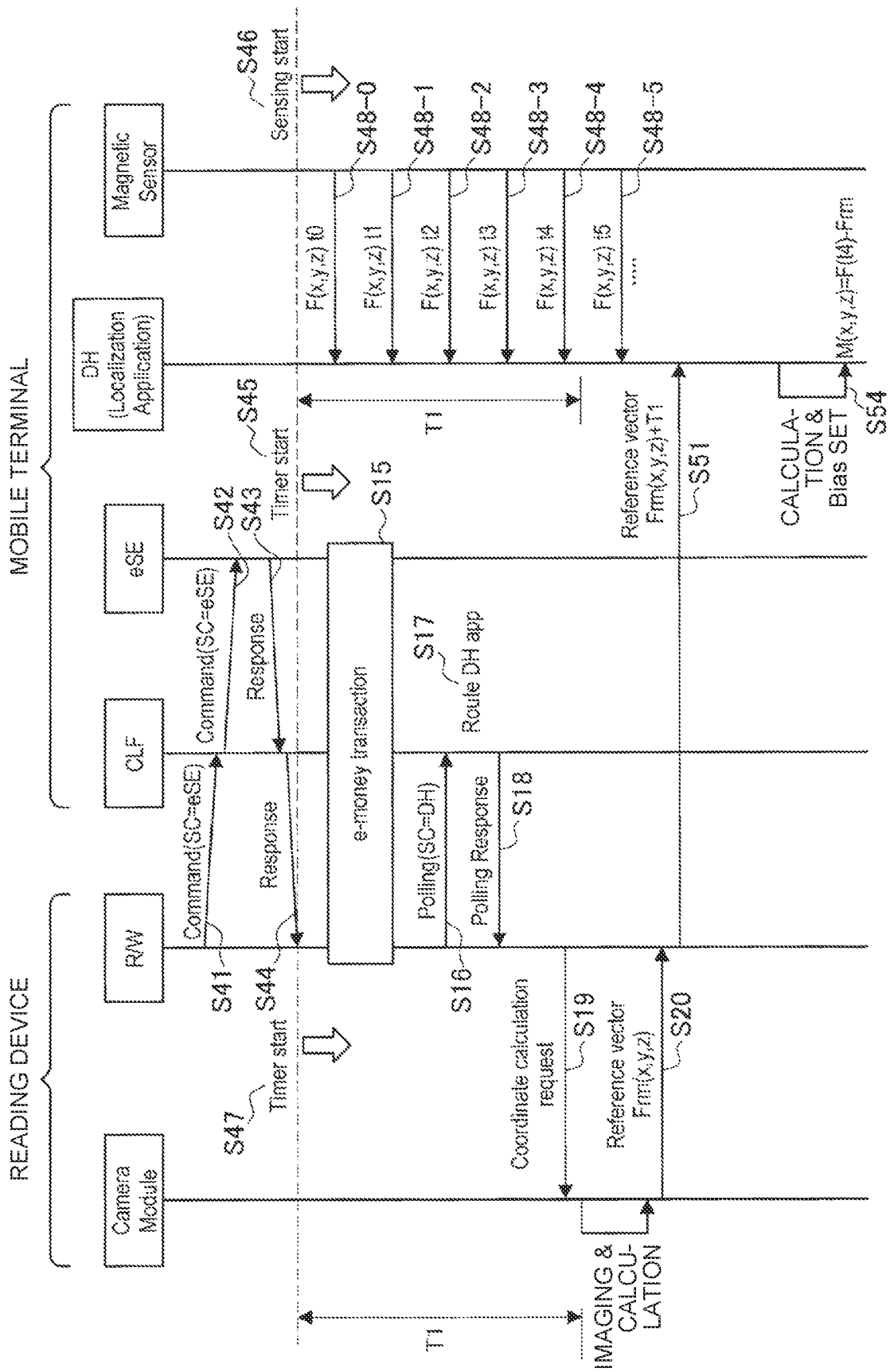
FIG. 15 is a sequence diagram illustrating an operation example of application example 3 of the information processing system according to the embodiment of the present closure.

FIG. 15 is a sequence diagram illustrating an operation example of application example 3 of the information processing system 1 according to the embodiment of the present disclosure. Here, a difference from the operation example illustrated in FIG. 10 in the operation example illustrated in FIG. 15 will be mainly described. As illustrated in FIG. 10, when the mobile terminal 10 is held over the reading device 20, the R/W 230 of the reading device 20 transmits polling addressed to the eSE. 130 to the mobile terminal 10 by non-contact communication (S41). In the mobile terminal 10, polling is received by the CLF 120 via the antenna 110, and the polling is output to the eSE 130 (S42).

The eSE 130 outputs the polling response to the CLF 120 (S43), and the CLF 120 transmits the polling response to the R/W 230 via the antenna 110 by non-contact communication (S44). The DH 140 starts a timer with transmission of a polling response as a trigger (S45) and starts sensing by the magnetic sensor 160 (S46). At this time, the DH 140 starts recording of a time stamp corresponding to the magnetic vector F output from the magnetic sensor 160. The control unit 220 starts the timer with the reception of the polling response as a trigger (S47). The magnetic vector F output from the magnetic sensor 160 is periodically output to the DH 140 (S48-0 to S48-5).

S15 to S20 illustrated in FIG. 15 are executed similarly to S15 to S20 illustrated in FIG. 10. Here, FIG. 15 illustrates an elapsed time T1 from the timer start time point to imaging. The R/W 230 transmits the magnetic vector Frm and the elapsed time T1 to the mobile terminal 10 by non-contact communication.

The CLF 120 receives the magnetic vector Frm and the elapsed time T1 via the antenna 110 by non-contact communication, and outputs the magnetic vector Frm and the elapsed time T1 to the DH 140 (S51). When receiving the magnetic vector Frm and the elapsed time T1, the DH 140 selects the magnetic vector F associated with the time stamp closest to the elapsed time T1. Here, a case where the magnetic vector F(t4) is selected is assumed. The DH 140 calculates a magnetic component vector M by subtracting the magnetic vector Frm from the selected magnetic vector F(t4), and sets the magnetic component vector N as a bias value (S54).

The application example 3 of the information processing system 1 according to the embodiment of the present disclosure has been described above.

5. CONCLUSION

As described above, according to the embodiment of the present disclosure, it is possible to obtain a more accurate external magnetic field vector (that is, the geomagnetic vector E+vector B) by removing the influence of sensor data magnetization output from the magnetic sensor of the mobile terminal 10. Then, the positioning accuracy of the mobile terminal 10 can be improved by a more accurate external magnetic field vector.

6. MODIFICATION

Although the preferred embodiments of the present disclosure have been described in detail with reference to the accompanying drawings, the technical scope of the present disclosure is not limited to such examples. It is obvious that a person having ordinary knowledge in the technical field of the present disclosure can conceive various changes or modifications within the scope of the technical idea described in the claims, and it is naturally understood that these also belong to the technical scope of the present disclosure.

For example, it is also possible to create a program for causing hardware such as a CPU, a RPM, and a RAM built in the computer to exhibit functions equivalent to the functions of the DH 140 described above. Furthermore, a computer-readable recording medium in which the program is recorded may also be provided.

Furthermore, for example, it is also possible to create a program for causing hardware such as a CPU, a ROM, and a RAM built in the computer to exhibit functions equivalent to the functions of the control unit 220 described above. Furthermore, a computer-readable recording medium in which the program is recorded may also be provided.

Furthermore, the effects described in the present specification are merely illustrative or exemplary, and are not restrictive. That is, the technology according to the present disclosure can exhibit other effects obvious to those skilled in the art from the description of the present specification together with or instead of the above effects.

Note that the following configurations also belong to the technical scope of the present disclosure.

(1)

An information processing apparatus comprising:

a calculation unit that calculates a terminal coordinate system magnetic vector on a basis of a spatial coordinate system magnetic vector and a posture of a communication terminal; and a notification unit that notifies the communication terminal of the terminal coordinate system magnetic vector by non-contact communication.

(2)

The information processing apparatus according to (1), wherein the spatial coordinate system magnetic vector includes sensor data output from a magnetic sensor of the information processing apparatus.

(3)

The information processing apparatus according to (1) or (2), wherein the posture of the communication terminal is recognized on a basis of an image captured by a camera module of the information processing apparatus.

(4)

The information processing apparatus according to (3), wherein the posture of the communication terminal is recognized on a basis of the image and acceleration detected by an acceleration sensor of the communication terminal.

(5)

The information processing apparatus according to any one of (1) to (4) wherein the notification unit notifies the communication terminal of the terminal coordinate system magnetic vector and predetermined reward information by non-contact communication.

(6)

The information processing apparatus according to any one of (1) to (5), wherein the notification unit notifies the communication terminal of position information of the information processing apparatus by non-contact communication.

(7)

The information processing apparatus according to (3), wherein the notification unit notifies: the communication terminal of an imaging time of the image by the camera module based on a predetermined timing.

(8)

An information processing apparatus comprising:

a notification unit that notifies a communication terminal of a spatial coordinate system magnetic vector by non-contact communication, wherein the communication terminal calculates a terminal coordinate system magnetic vector on a basis of the spatial coordinate system magnetic vector and a posture of the communication terminal.

(9)

An information processing method comprising:

calculating a terminal coordinate system magnetic vector on a basis of a spatial coordinate system magnetic vector and a posture of a communication terminal; and notifying the communication terminal of the terminal coordinate system magnetic vector by non-contact communication.

(10)

A communication terminal comprising:

an acquisition unit that acquires a terminal coordinate system magnetic vector calculated by an information processing apparatus on a basis of a spatial coordinate system magnetic vector and a posture of the communication terminal from the information processing apparatus by non-contact communication.

(11)

The communication terminal according to (10), further comprising:

a specifying unit that calculates a bias value on a basis of first sensor data output from a magnetic sensor of the communication terminal and the terminal coordinate system magnetic vector, and specifies position information of the communication terminal on a basis of the bias value, second sensor data output from the magnetic sensor of the communication terminal, and a magnetic vector map indicating a magnetic vector for each position in a real space.

(12)

The communication terminal according to (11), wherein the specifying unit subtracts the bias value from the second sensor data, and when a magnetic vector matching or similar to a vector obtained by subtracting the bias value from the second sensor data is found in the magnetic vector map, specifies position information corresponding to the found magnetic vector as position information of the communication terminal.

(13)

The communication terminal according to any one of (10) to (12), further comprising:

an output control unit that controls display of information regarding the terminal coordinate system magnetic vector.

(14)

The communication terminal according to any one of (10) to (13), wherein the acquisition unit acquires the terminal coordinate system magnetic vector and predetermined reward information from the information processing apparatus by non-contact communication.

(15)

The communication terminal according to (14), further comprising:

an output control unit that controls display of the predetermined reward information.

(16)

The communication terminal according to (11), wherein the specifying unit specifies the position information of the information processing apparatus as the position information of the communication terminal in a case where the position information of the information processing apparatus is acquired from the information processing apparatus by non-contact communication.

(17)

The communication terminal according to (11), wherein the acquisition unit acquires an imaging time of an image for recognition of a posture of the communication terminal based on a predetermined timing, and acquires, as the first sensor data, sensor data whose sensing time based on the predetermined timing is closest to the imaging time among a plurality of pieces of sensor data periodically output from the magnetic sensor.

(18)

A communication terminal comprising:

an acquisition unit that acquires a spatial coordinate system magnetic vector from an information processing apparatus by non-contact communication; and a calculation unit that calculates a terminal coordinate system magnetic vector on a basis of the spatial coordinate system magnetic vector and a posture of the communication terminal.

(19)

A communication method performed by a communication terminal, the method comprising:

acquiring a terminal coordinate system magnetic vector calculated by an information processing apparatus on a basis of a spatial coordinate system magnetic vector and a posture of the communication terminal from the information processing apparatus by non-contact communication.

(20)

A program for causing a computer to function as a communication terminal including:

an acquisition unit that acquires a terminal coordinate system magnetic vector calculated by an information processing apparatus on a basis of a spatial coordinate system magnetic vector and a posture of the communication terminal from the information processing apparatus by non-contact communication.

REFERENCE SIGNS LIST

1 INFORMATION PROCESSING SYSTEM
10 MOBILE TERMINAL
110 ANTENNA
120 CLF
130 eSE
150 INPUT UNIT
160 MAGNETIC SENSOR
170 DISPLAY UNIT
20 READING DEVICE
220 CONTROL UNIT
240 MAGNETIC SENSOR
250 CAMERA MODULE
260 INPUT/OUTPUT UNIT
30 POS TERMINAL

The invention claimed is:

1. An information processing apparatus comprising:
a calculation unit configured to calculate a terminal coordinate system magnetic vector of a communication terminal configured to communicate with the information processing apparatus by non-contact communication, on a basis of a spatial coordinate system magnetic vector measured by a magnetic sensor of the information processing apparatus and a posture of the communication terminal; and
a notification unit configured to notify the communication terminal of the terminal coordinate system magnetic vector by the non-contact communication, wherein
the calculation unit and the notification unit are each implemented via at least one processor.

2. The information processing apparatus according to claim 1, wherein
the spatial coordinate system magnetic vector includes sensor data output from the magnetic sensor of the information processing apparatus.

3. The information processing apparatus according to claim 1, wherein
the notification unit is further configured to notify the communication terminal of the terminal coordinate system magnetic vector and predetermined reward information by the non-contact communication.

4. The information processing apparatus according to claim 1, wherein
the notification unit is further configured to notify the communication terminal of position information of the information processing apparatus by the non-contact communication.

5. An information processing apparatus comprising:
a notification unit configured to notify a communication terminal of a spatial coordinate system magnetic vector measured by a magnetic sensor of the information processing apparatus by non-contact communication, wherein
the communication terminal calculates a terminal coordinate system magnetic vector of the communication terminal on a basis of the spatial coordinate system magnetic vector and a posture of the communication terminal, and
the notification unit is implemented via at least one processor.

6. A communication terminal comprising:
an acquisition unit configured to acquire a terminal coordinate system magnetic vector of a communication terminal from an information processing apparatus by non-contact communication, wherein
the information processing apparatus calculates the terminal coordinate system magnetic vector on a basis of a spatial coordinate system magnetic vector measured by a magnetic sensor of the information processing apparatus and a posture of the communication terminal.

7. The communication terminal according to claim 6, further comprising:
an output control unit configured to control display of information regarding the terminal coordinate system magnetic vector, wherein
the output control unit is implemented via at least one processor.

8. The communication terminal according to claim 6, wherein
the acquisition unit is further configured to acquire the terminal coordinate system magnetic vector and predetermined reward information from the information processing apparatus by the non-contact communication.

9. The communication terminal according to claim 8, further comprising:
an output control unit configured to control display of the predetermined reward information, wherein
the output control unit is implemented via at least one processor.

10. A communication terminal comprising:
an acquisition unit configured to acquire a terminal coordinate system magnetic vector calculated by an information processing apparatus on a basis of a spatial coordinate system magnetic vector and a posture of the communication terminal from the information processing apparatus by non-contact communication; and
a specifying unit configured to calculate a bias value on a basis of first sensor data output from a magnetic sensor of the communication terminal and the terminal coordinate system magnetic vector, and specify position information of the communication terminal on a basis of the bias value, second sensor data output from the magnetic sensor of the communication terminal, and a magnetic vector map indicating a magnetic vector for each position in a real space.

11. The communication terminal according to claim 10, wherein
the specifying unit is further configured to subtract the bias value from the second sensor data, and when a magnetic vector matching or similar to a vector obtained by subtracting the bias value from the second sensor data is found in the magnetic vector map, specify position information corresponding to the found magnetic vector as position information of the communication terminal.

12. The communication terminal according to claim 10, wherein
the acquisition unit is further configured to acquire an imaging time of an image for recognition of a posture of the communication terminal based on a predetermined timing, and acquire, as the first sensor data, sensor data whose sensing time based on the predetermined timing is closest to the imaging time among a plurality of pieces of sensor data periodically output from the magnetic sensor.

13. A communication terminal comprising:
an acquisition unit configured to acquire a spatial coordinate system magnetic vector measured by a magnetic sensor of an information processing apparatus from the information processing apparatus by non-contact communication; and
a calculation unit configured to calculate a terminal coordinate system magnetic vector of the communication terminal on a basis of the spatial coordinate system magnetic vector and a posture of the communication terminal, wherein
the acquisition unit and the calculation unit are each implemented via at least one processor.

14. A communication method performed by a communication terminal, the method comprising:
acquiring a terminal coordinate system magnetic vector of a communication terminal from an information processing apparatus by non-contact communication, wherein
the information processing apparatus calculates the terminal coordinate system magnetic vector on a basis of a spatial coordinate system magnetic vector measured by a magnetic sensor of the information processing apparatus and a posture of the communication terminal.

15. A non-transitory computer-readable medium having embodied thereon a program, which when executed by a computer causes the computer to execute a communication method executed by a communication terminal, the method comprising:
  acquiring a terminal coordinate system magnetic vector of a communication terminal from an information processing apparatus by non-contact communication, wherein
  the information processing apparatus calculates the terminal coordinate system magnetic vector on a basis of a spatial coordinate system magnetic vector measured by a magnetic sensor of the information processing apparatus and a posture of the communication terminal.

* * * * *